United States Patent [19]

Washizuka et al.

[11] Patent Number: 4,912,462
[45] Date of Patent: Mar. 27, 1990

[54] LETTER INPUT DEVICE FOR ELECTRONIC WORD RETRIEVAL DEVICE

[75] Inventors: Isamu Washizuka; Mitsuhiro Saiji, both of Soraku, Japan

[73] Assignee: Sharp Kabushiki Kaisha, Osaka, Japan *

[21] Appl. No.: 516,951

[22] Filed: Jul. 25, 1983

[30] Foreign Application Priority Data

Jul. 29, 1982 [JP] Japan ............................ 57-133161
Jul. 29, 1982 [JP] Japan ............................ 57-133162

[51] Int. Cl.⁴ .................................... G09G 3/02
[52] U.S. Cl. ............................... 340/711; 341/22
[58] Field of Search ........ 340/365 S, 365 R, 365 VL, 340/712, 711, 706; 178/18; 200/5 A, 86 R; 400/479, 479.1

[56] References Cited

U.S. PATENT DOCUMENTS

| | | | |
|---|---|---|---|
| 3,641,299 | 2/1972 | Mayer | 200/86 R |
| 4,068,089 | 1/1978 | Kuhnlein et al. | 340/365 S |
| 4,242,676 | 12/1980 | Piguet et al. | 340/365 C |
| 4,246,494 | 1/1981 | Foreman et al. | 307/116 |
| 4,335,374 | 6/1982 | Nyuji | 340/365 S |
| 4,408,101 | 10/1983 | Brodbeck | 340/365 VL |
| 4,477,797 | 10/1984 | Nakagiri | 340/712 |
| 4,481,508 | 11/1984 | Kamei et al. | 340/365 VL |

Primary Examiner—David K. Moore
Assistant Examiner—Richard Hjerpe

[57] ABSTRACT

An input device for a word information storage and retrieval device such as an electronic dictionary includes a single multiconduct bar switch, a detection circuit, a shift circuit, and a display. The single bar switch corresponds to a plurality of letters or characters, such that the single bar switch is operable to input each one of the plurality of letters of characters depending on the actuated position of the bar switch. The detection circuit is responsive to the single bar switch for detecting the actuated position of the single bar switch and for detecting which of the plurality of letters or characters is input. The display is responsive to the detection circuit for displaying a detected one of the plurality of letters or characters input. The shift circuit is operable to shift the selection of the detected one of the plurality of letters or characters.

8 Claims, 12 Drawing Sheets

LETTER INPUT DEVICE FOR ELECTRONIC WORD RETRIEVAL DEVICE

BACKGROUND OF THE INVENTION

The present invention relates to a word information storage and retrieval device and, more particularly, to a letter input device for a word information storage and retrieval device such as an electronic dictionary.

A conventional letter input device for a word information storage and retrieval device such as an electronic dictionary comprises a keyboard including a plurality of key switches each corresponding to each letter. Each of the key switches is actuated to input a specific letter. However, this input system has required a rather wide keyboard including the plurality of key switches. Although it is desirable that an electronic apparatus such as an electronic dictionary be as compact as possible, it has been difficult to miniaturize the size of the keyboard in view of the manual operations. Alternatively, it has been proposed that the electronic dictionaries utilize keyboards having a reduced number of key switches selected from the plurality of key switches of the keyboard actuated to input a great number of letters. However, the key input of such an input device is rather complicated and requires a long time to input a word having a large number of letters.

Therefore, it is desired that a compact letter input device be provided for inputting a word having a large number of letters in a short period of time.

SUMMARY OF THE INVENTION

Accordingly, it is an object of the present invention to provide an improved and compact letter input device for a word information storage and retrieval device such as an electronic dictionary for inputting letters.

It is another object of the present invention to provide an improved letter input device for an electronic dictionary for inputting letters, the letter input device comprising a single bar switch corresponding to a plurality of key switches.

It is a further object of the present invention to provide an improved letter input device for an electronic dictionary for inputting letters, the letter input device comprising a single bar switch corresponding to a plurality of key switches, so that the input of each one of the plurality of key switches is identified by detecting the depressed position of the single bar switch.

Briefly described, in accordance with the present invention, an alphabet or letter input device for a word information storage and retrieval device such as an electronic dictionary including an electronic translator and an electronic language dictionary etc. is characterized in that the input device comprises at least one single bar switch corresponding to a plurality of alphabets or letters, detection means for detecting the actuated position of the single bar switch along the alignment direction of the key switches near the single bar switch to detect the actuation of each one of the key switches, to input said each one of the key switches and display the corresponding letter, and a key forward or backward switch actuated to shift the selection of a previous one of the key switches to a new adjacent key switches, whereby the previous selection of one of the key switches is erased and selection of the new adjacent key switch is displayed.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 2(1) to 2(3); 6(1) to 6(4), 10(1) to 10(6), and 12 show examples representative of a letter input operation using a letter input device in the electronic dictionary of FIG. 1;

DESCRIPTION OF THE INVENTION

Figure 1:
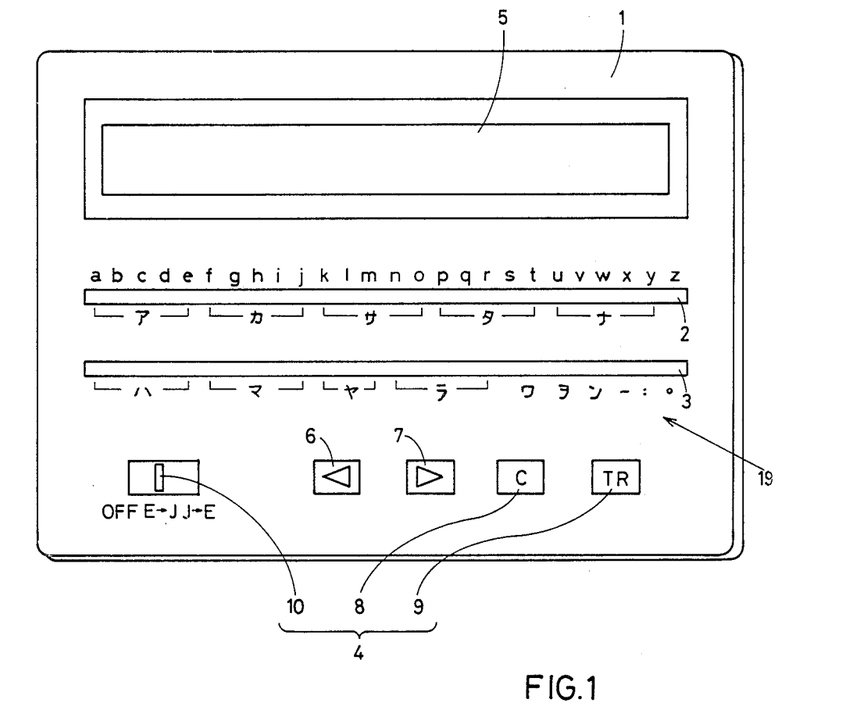
FIG. 1 shows a plan view of an electronic dictionary according to the present invention.
Figure 2:
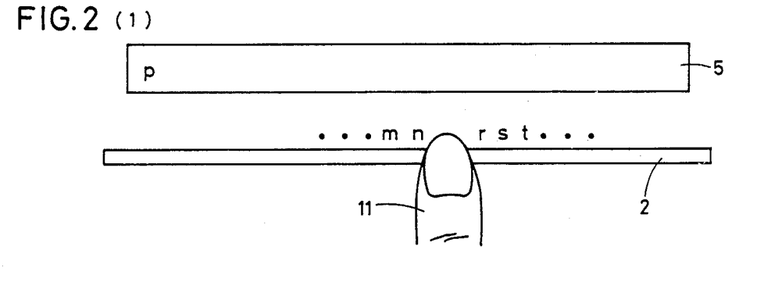

FIG. 1 shows a word information storage and retrieval device such as an electronic translation dictionary according to the present invention. In the electronic translation dictionary as shown, letters can be input. It may be evident that any other letters, characters, figures, or symbols etc. can be input by the input device of a type similar to the letter input device of the present invention.

Further, although the apparatus of FIG. 1 is an electronic translator for translating one or more first words in a first language into one or more second words in a second language, the present invention can be applied to any other type of electronic device if the other type of electronic device includes an input device for inputting at least one letter or character. Such an electronic device may include any type of electronic calculator, electronic dictionary, electronic translator, electronic language dictionary or the like. The electronic language dictionary is for outputting description word data in a language in response to the input of one or more entry words in the same language.

The electronic translation dictionary of FIG. 1 is an electronic translator for translating English to Japanese and vice versa.

The electronic translation dictionary of FIG. 1 comprises, on a front surface of a body 1, a keyboard 19 having one single bar switch 2, a corresponding bar switch 3, a letter backward-search key 6, a letter forward-search key 7, function keys 4, and a display 5.

The bar switch 2 is actuated to input 26 English letters and some Japanese alphabets (Katakanas). These English letters and Japanese alphabets are aligned according to a prescribed order on a line. The corresponding bar switch 3 is actuated to input the remaining Japanese alphabets and peculiar symbols aligned in a specified order on a line.

The display 5 displays the letters and the Japanese alphabet characters input into the device. The letter backward-search key 6 is actuated to shift the selection of a letter or alphabet from the letter or alphabet previously input and presently displayed in the display 5 to an earlier letter or alphabet in the alignment order. The letter forward-search key 7 is actuated to shift the selection of a letter or alphabet from the letter or alphabet previously inputted and presently displayed to a subsequent letter or alphabet in the alignment order.

The function keys 4 include a clear key 8, a translation key 9, and a mode selector 10. The clear key 4 is actuated to cancel the input of letters or alphabets. The translation key 9 is actuated to translate the input one or more letters or alphabets from English to Japanese and vice versa.

The mode selector 10 slides to select one mode including a power-off mode, a power-on mode, an English translation mode, and a Japanese to English translation mode. In the English to Japanese translation mode, one or more English letters are input. In the Japanese to English translation mode, one or more Japanese alphabet characters and peculiar symbols are input. The position for selecting the English to Japanese translation mode is denoted as "E→J" in FIG. 1. The position for selecting the Japanese to English translation mode is denoted as "J→E" in FIG. 1.

In the English to Japanese translation mode selected by the mode selector 10, the bar switch 2 is actuated to subsequently input one or more English letters. In the Japanese to English translation mode, the bar switches 2 and 3 are both actuated to subsequently input one or more Japanese alphabets or the peculiar symbols. When the thus key-input letter or alphabet is not intended, the letter backward-search key 6 or the letter forward-search key 7 is operated to change the letter or alphabet.

FIGS. 2(1) to 2(3) show examples of inputting one or more English letters while the English to Japanese translation mode is selected.

FIG. 2(1): One part of the bar switch 2 corresponding to a labeled English letter "p" on the body 1 is depressed by a finger 11 of the operator to input and display the letter "p" in the top digit of the display 5.

FIG. 2(2): When the letter "p" is not intended to be inputted and, otherwise, a letter "o" is intended, the letter backward-search key 6 is actuated to backspace by one letter, so that the previously selected letter "p" is replaced by a new letter "o".

FIG. 2(3): When another part of the bar switch 2 corresponding to a labeled English letter "n" on the body 1 is depressed, the letter "n" is input and displayed in the second digit of the display 5. Thus, letters "on" have been input and displayed.

One or more of any desired letters or alphabets can be input in this manner.

Figure 3:
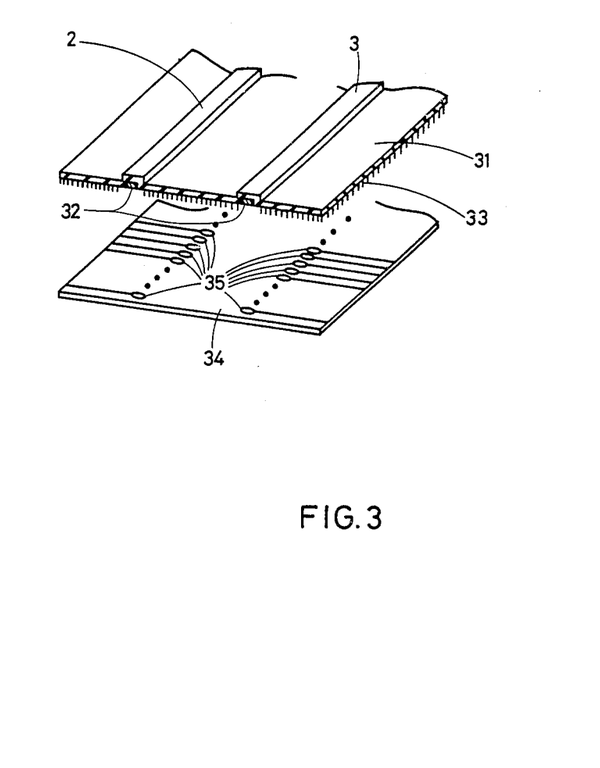
FIG. 3 shows a sectional view of the letter input device of FIG. 2.

FIG. 3 shows a sectional view of the keyboard 19 near the bar switches 2 and 3.

The keyboard 19 comprises a flexible insulating sheet 31, two contact bars 32, a plurality of pins 33, and bar contact terminals 35 disposed on a base 34.

The flexible insulating sheet 31 is made of any elastomer. This sheet 31 provides the two bar switches 2 and 3. The two bar switches 2 and 3 extend along the longitudial direction of the sheet 31 while they protrude from the main surface of the sheet 31. On each of the downward facing surfaces of the bar switches 2 and 3, each of the two contact bars 32 is embedded. The contact bars 32 are made of flexible and electrically conductive elastomer.

On the downward facing surface of the sheet 31, the plurality of pins 33 are disposed. On the upward facing surface of the base 34 confronting the downward facing surface of the sheet 31, the bar contact terminals 35 are aligned with each terminal 35 confronting one of the contact bars 32.

The combination of both the bar switch 2 or 3, and one of the key contact terminals 35 forms a single key switch. The distances between two of the bar contact terminals 35 should be somewhat narrower than the possible width of the finger 11. Thus, the combinations of the bar contacts 32 and the bar contact terminals 35 provide a plurality of key switches.

When the finger 11 depresses a specific portion of each one of the two bar switches 2 and 3, the portion of said of the bar contacts 32 contacts with one of the bar contact terminals 35, so that the key switch below the finger 11 becomes conductive. The letter or alphabet related to this position of the bar switches 2 and 3 is input by detecting the conductive position of the key switch. After the key input operation is completed, the finger 11 is separated from said each one of the bar switches 2 and 3. The plurality of pins 33 snap the actuated key switch off.

Figure 4:
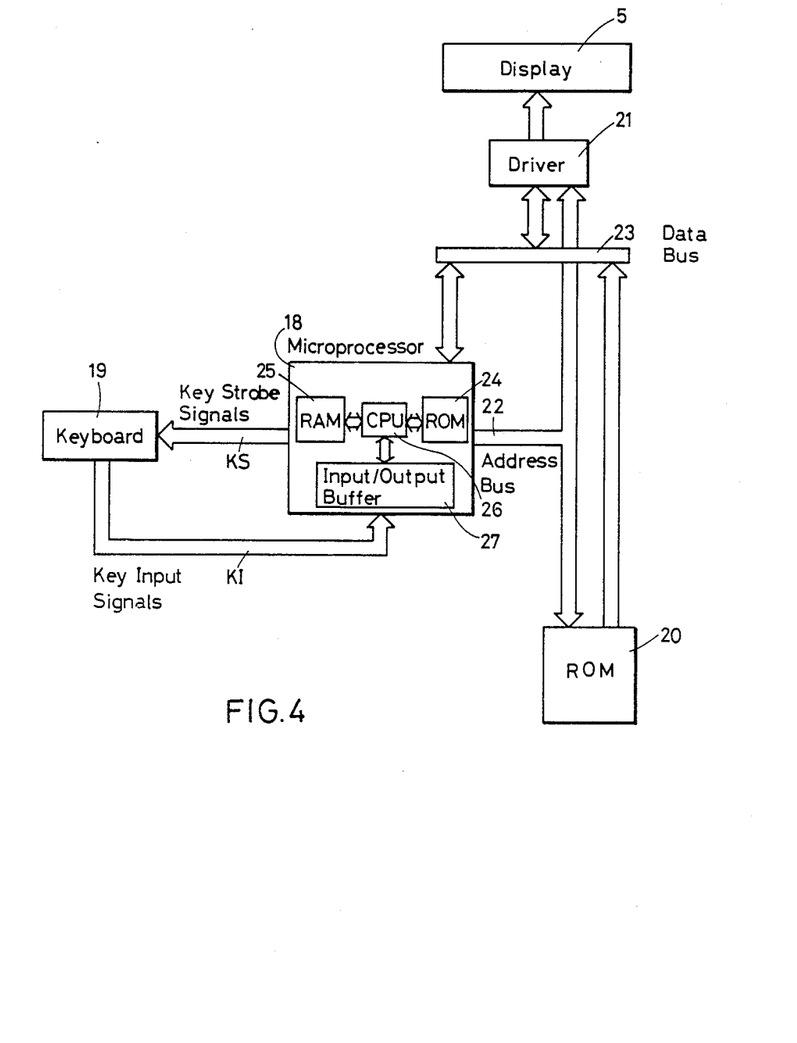
FIG. 4 shows a block diagram of a circuit implemented within the electronic dictionary of FIG. 1.

FIG. 4 shows a block diagram of a circuit implemented within the electronic translation dictionary of FIG. 1.

The circuit of FIG. 4 comprises the display 5, a microprocessor 18, the keyboard 19, a ROM 20, and a driver 21. An address bus 22 and a data bus 23 are provided for data communication.

The microprocessor 19 develops key strobe signals KS toward the keyboard 19 and receives key input signals KI from the keyboard 19 to detect the operations of the key switches in the keyboard 19. The microprocessor 18 selects an address of the ROM 20 via the address bus 22 to read in the storage data in the address of the ROM 20 via the data bus 23.

The microprocessor 18 comprises a ROM 24, a RAM 25, a CPU 26 and an input/output buffer 27. An inner bus is provided for interconnecting the ROM 24, the RAM 25, the CPU 26, and the input/output buffer 27. The ROM 24 stores a control program. The RAM 25 provides registers A, B, C, S, X and Y, a pointer P, and a flag F etc. The CPU 26 serves to control calculation operations.

The ROM 20 stores a great number of English words and Japanese words used for the translation modes.

The driver 21 is responsive to display pattern information provided by the microprocessor 18 for controlling illumination of the dots in the display 5. According to the present invention, the driver 21 includes a memory for storing display and erase information corresponding to the dots of the display 5. Once some display information is set into the memory of the driver 21 by the microprocessor 18, the driver 21 continues to develop the set display information toward the display 5 before new display information is provided by the microprocessor 18.

Figure 5:
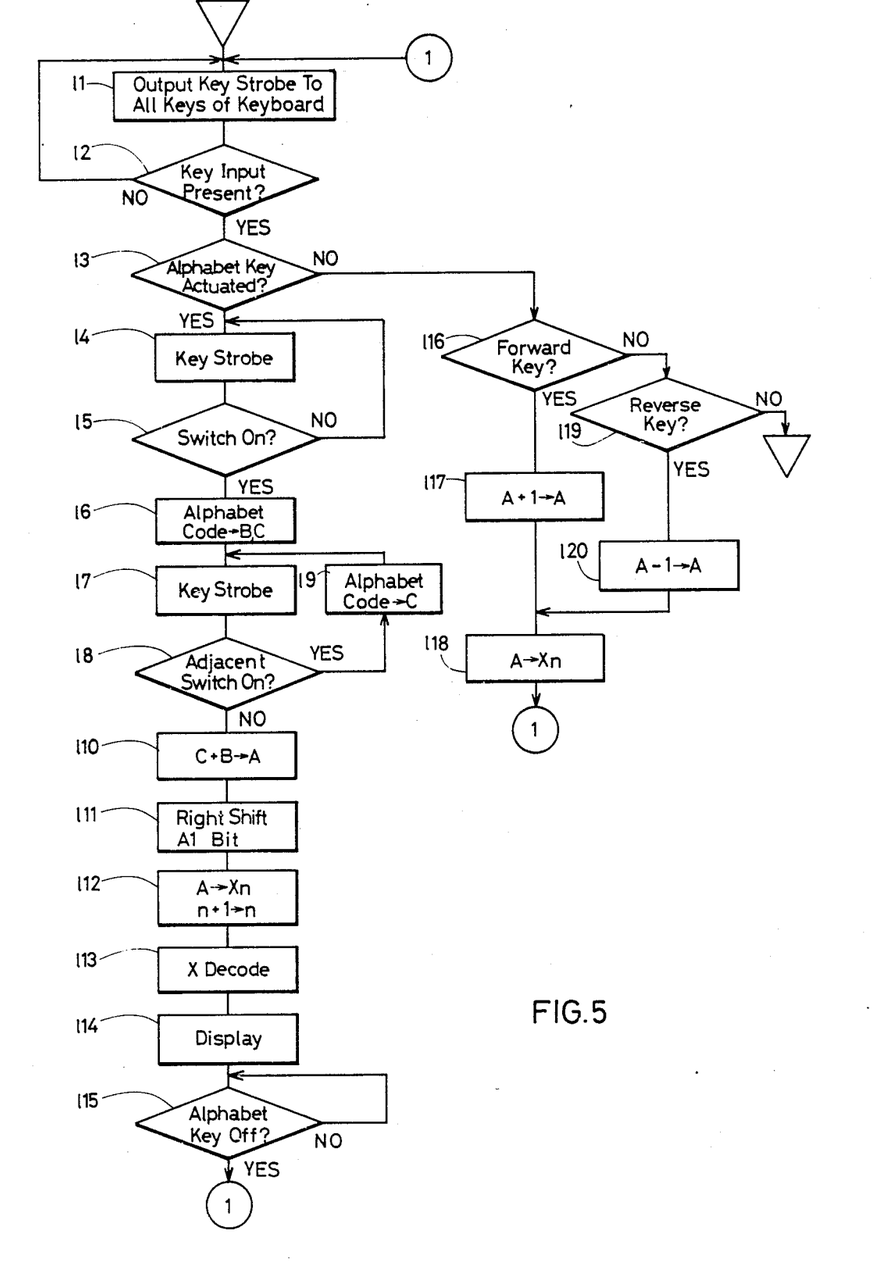
FIGS. 5, 7, 8, 11 and 13 each show a flow chart of the operations of the electronic dictionary according to the present invention.
Figure 6:
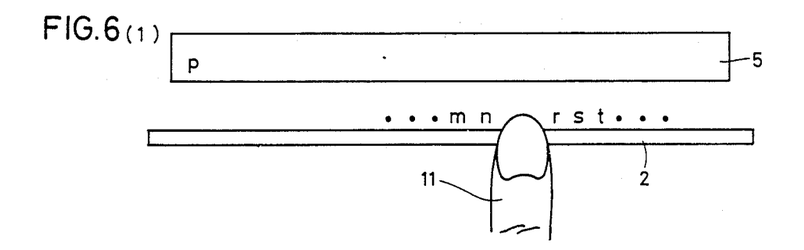

FIG. 5 shows a flow chart of the operation of the electronic translation dictionary according to the present invention.

Steps 11 and 12: The key strobe signals KS are applied to all the key switches of the keyboard 19.

Step 12: It is detected whether any of the key switches is actuated to input a letter or alphabet. If any key input operation is absent, step 11 is reselected. If some key input operation is present, the program is advanced to select step 13.

Step 13: It is detected whether either of the bar switches 2 and 3 is depressed.

Step 14: When either of the bar switches 2 and 3 is indeed actuated, step 14 is selected in which the key strobe signals KS are subsequently imparted to the bar switches 2 and 3.

Step 15: It is detected which key switch related to the bar switches 2 and 3 is depressed by detecting which part of each one of the bar switches 2 and 3 is depressed and becomes conductive. When no return signals KI from the key switches are present, step 14 is reselected. When any return signals KI are present, step 16 is selected.

Step 16: Code information corresponding to the conductive key switch is entered into the registers B and C.

Step 17: The key strobe signals KS are outputted to detect whether one or more key switches adjacent to the key switch depressed become conductive.

Step 19: This step is selected when one or more adjacent key switches are conductive, so that the storage contents of the register C are canceled and code information corresponding to are adjacent key switch is stored into the register C. Thereafter, step 17 is reselected. After it is detected that said adjacent key switches are nonconductive, steps 18 to 110 are selected to detect the two edges of the depressed portion.

Step 110: The letter code in the register B and the letter code in the register C are added by the CPU 26, so that the results are stored into the register A.

Step 111: The contents of register A are shifted rightward by one bit.

Step 112: The shifted contents of register A are stored into the n figure of register X. The value of "n" indicates the display position. The pointer P is directed to increment by "1" to await the successive letter input.

For example, it is assumed that the positions of the bar switch 2 centering at the portion corresponding to the labeled letter "p" are depressed, whereby the key switches corresponding to three letters "o", "p", and "q" are actuated. Then, the register B stores, for example, a letter code "00000011". The register C stores, for example, a letter code "00000101". Therefore, the register A stores the letter code "00001000". The CPU 26 calculates half of the contents of register A, so that the register X stores the letter code "00000100" corresponding to the letter "p". Thus, the one-bit right shift of the contents of register A is identical with the calculation of half of the contents of register A. The odd number is raised to a unit or ignored.

Thus, the letter corresponding to the center of the actuated portions of each one of the bar switches 2 and 3 is actually input.

Step 113: The letter codes stored into the register X in step 112 are decoded by the driver 21.

Step 114: The display 5 displays the letter "p".

Step 115: It is detected whether the bar switches 2 and 3 can be separated. Until this is confirmed, step 115 is repeated. When this separation is confirmed, step 11 is reselected.

Step 116: When no key input operations to the bar switches 2 and 3 can be detected in step 13, step 116 is selected in which it is detected whether the letter forward search key 7 is actuated.

Step 117: When the key 7 is actuated, step 117 is selected, so that the contents of the register A are directed to increment by "1".

Step 118: The incremented contents of the register A are stored in the n figure of register X by causing a decrement of "1". Thereafter, step 11 is reselected.

Thus, when the letter "p" displayed in step 114 is not intended to be input, the letter forward-search key 7 is actuated to input and display another letter "q" in the display 5.

Step 119: It is detected whether the letter backward-search key 6 is actuated.

Step 120: When the key 6 is actuated, step 120 is selected in which the contents of the register A are directed to decrement by "1". The contents of register A which are directed to decrement by "1" in step 118 are stored into the n figure of register X by causing an increment of "1". Thereafter, step 11 is reselected.

Thus, the letter "p" displayed in step 114 is not intended, the key 6 is actuated, so that another letter "o" is input and displayed in the display 5.

When key 6 is not detected in step 119, the other key processing routines for the function keys 4 are selected. Thereafter, step 11 is reselected.

Attention is now directed to another preferred form of the present invention.

FIGS. 6(1) to 6(4) show an example of inputting a specific letter using the letter input device of the present invention, in which the electronic translation dictionary is placed in the English to Japanese translation mode. The key switch suitable for the operations of FIGS. 6(1) to 6(4) is of the type shown in FIG. 3.

FIG. 6(1): The finger 11 depresses the portions of the bar switch 2 centering around the portion corresponding to the labeled letter "p", so that the letter "p" is input and displayed in the display 5.

FIG. 6(2): While the depression of the bar switch 2 is continued, the finger 11 is rotated or shifted near the position corresponding to another labeled letter "q", so that the letter "q" is input and displayed in place of the letter "p".

FIG. 6(3): While the depression of the bar switch 2 is continued, the finger 11 is rotated or shifted toward the portion of another letter "o", so that the letter "q" is replaced by the letter "o". When, under these circumstances, the finger 11 is separated from the bar switch 2, the input of the letter "o" is displayed in the top digit of the display 5 as an effective input.

FIG. 6(4): The finger 11 depresses the portion of the bar switch 2 near the letter "v", so that the letter "v" is input and displayed in the second digit of the display 5. When, under these circumstances, the finger 11 is separated from the bar switch 2, the input of the letter "v" at the second digit is displayed as another effective input.

Figure 7:
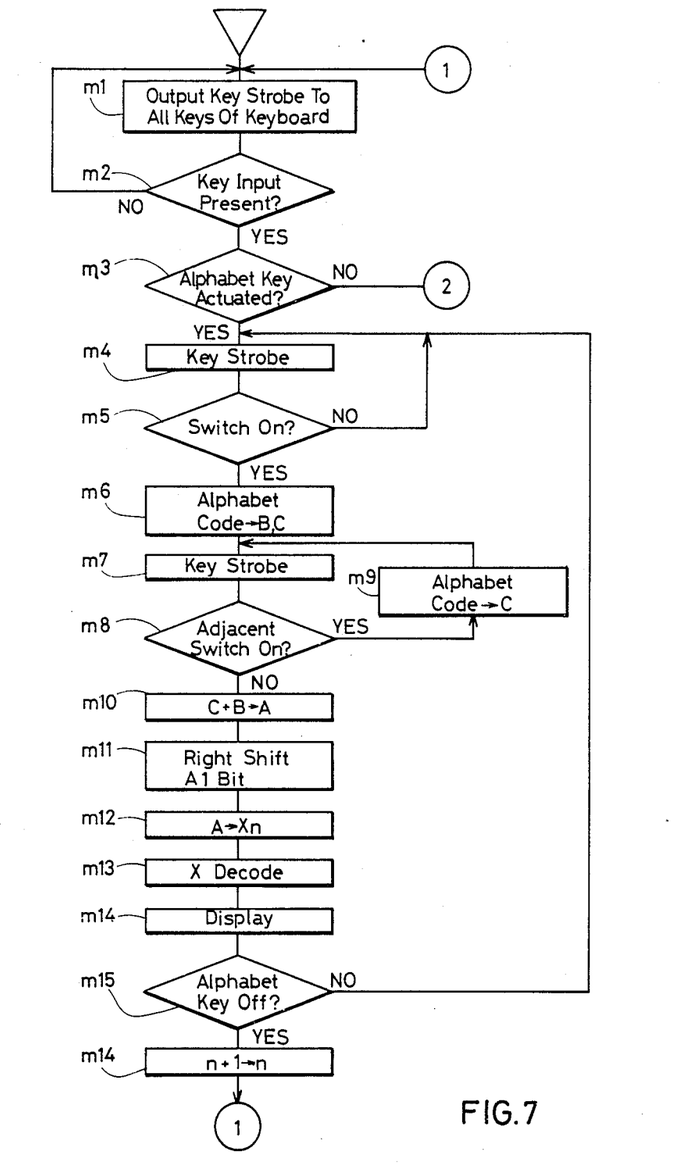
Figure 8:
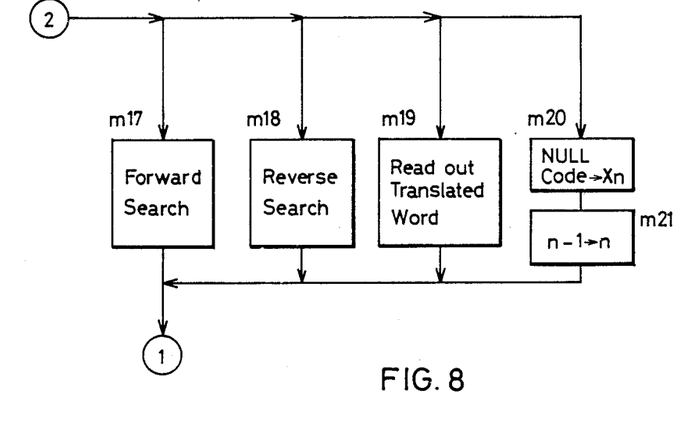

FIGS. 7 and 8 are flow charts of the operations of the electronic translation dictionary of the present invention.

Steps m1 to m11, m13, and m14 of FIG. 7 are identical with steps 11 to 111, 113, and 114 of FIG. 5, respectively.

Step m12: The contents of register A which are shifted to the right "1" bit in step m11 are stored in the n figure of register X. The value of "n" indicates a display position.

Step m15: It is detected whether the finger 11 is separated from the bar switch 2 or 3. When the separation is detected, step m4 is reselected. Since the displayed letter is not intended to be input and displayed, the selection of the finger 11 must be changed by rolling or shifting. When it is confirmed that the finger 11 is separated, step m16 is selected.

Step m16: The desired letter is input and displayed in step m16. The pointer P is subjected to increment by "1", so that the next digit is selected. Thereafter, step m1 is reselected.

The flow chart of FIG. 8 is selected when no key input is detected in step m3 as to the bar switch 2 or 3. The flow chart of FIG. 8 is related to the operations of the function keys 4.

Step m17: When the letter forward-search key 7 is actuated, the forward search is carried out in step m17.

Step m18: When the letter backward-search key 6 is actuated, step m18 is selected to perform the backward search operation.

Step m19: When the translation key 9 is actuated, step m19 is selected to retrieve the translated words.

Step m20: When the clear key 8 is acutated, step m20 is selected to input a null code into the n figure of register X.

Step m21: The pointer P is directed to decrement by "1". Thus, the key input is carried out at the preceding digit by one.

After steps m17 to m20 are completed, step m1 is reselected.

Attention is now directed to a further preferred embodiment of the present invention.

Figure 9:
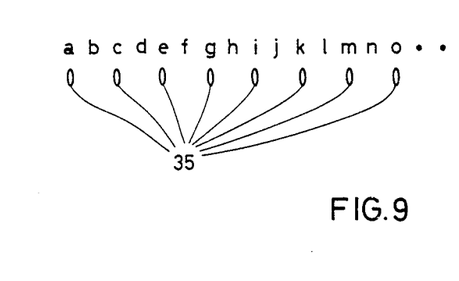
FIG. 9 shows the relation between contact points and letters in the letter input device according to the present invention.
Figure 10:
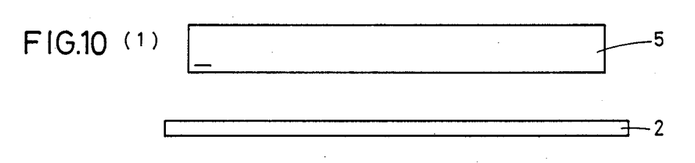

FIG. 9 shows the relation between the key contact terminals 35 and the letters in this further preferred form of the present invention.

Each one of the key contact terminals 35 corresponds to an alternate letter such as "a", "c", "e", etc. When the portion of the bar switch 2 near the postion corresponding to a labeled letter "b" is depressed, at least two terminals 35 each corresponding to the labeled letters "a" and "c" should become conductive, so that the input of the letter "b" can be detected.

It may be possible that the intervals between the terminals 35 are not identical with all the labeled letters. In such a case, the positions and the number of the terminals which may become conductive can identify the kind of key switch actuated. Further, the bar switch need not be straight, and, instead, the switch 2 or 3 may be a matrix or round switch.

Attention is again directed to a further preferred form of the present invention.

Figure 11:
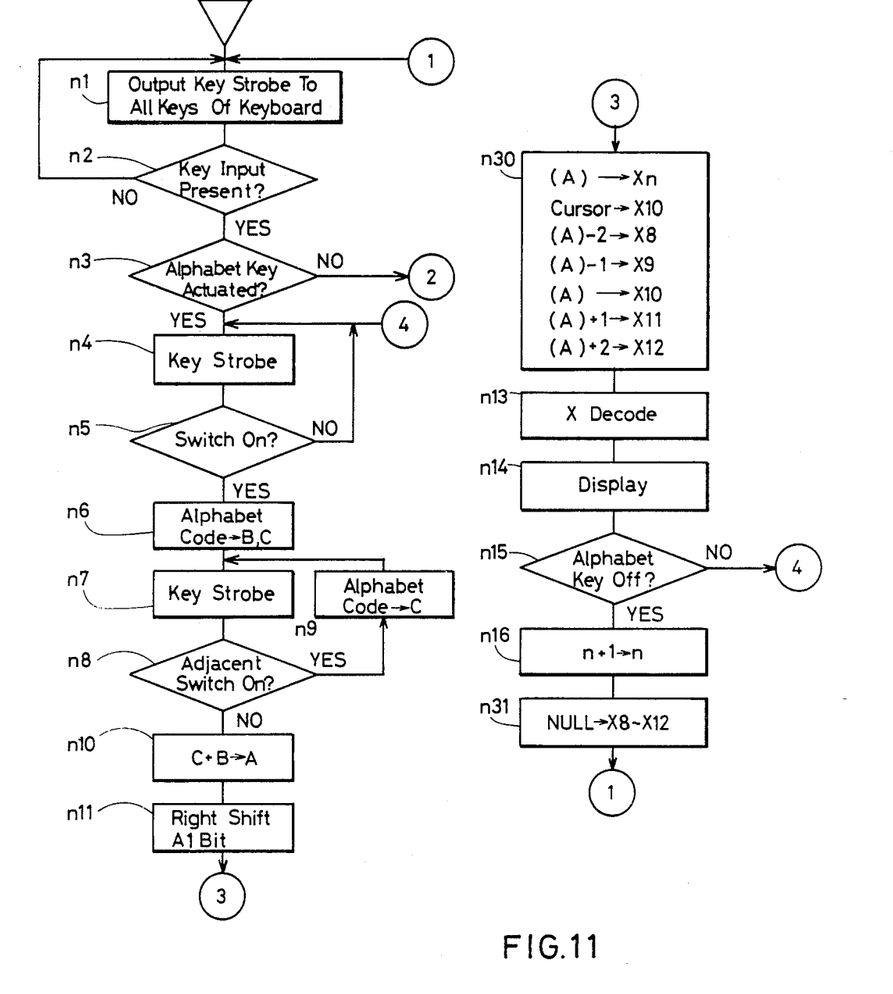

FIGS. 10(1) to 10(6) show examples of inputting letters according to a further preferred embodiment of the present invention. FIG. 11 shows a flow chart of the input operation in this case.

FIG. 10(1): While the finger 11 is separated from the key switches 2 and 3, a cursor is displayed at the digit to which any letter is to be input and displayed.

FIG. 10(2): When the finger 11 depresses the portion of the bar switch 2 near the portion corresponding to the labeled letter "p", the letter "p" is displayed at this digit. Simultaneously, at least one and preferably five letters, "nopqr" near the letter "p", with a cursor under the letter "p" are displayed. This letter display will assist in inputting the intended letter.

FIG. 10(3): When the finger 11 is rotated rightward, the letter "q" and the letters "opqrs" with the cursor under the letter "q" are displayed.

FIG. 10(4): When the finger 11 is rotated leftward, the letter "o" and the letters "mnopq" with the cursor under the letter "o" are displayed.

FIG. 10(5): Once the finger 11 is separated from the bar switch 2, the letter "o" is determined to be input and displayed, in which case the cursor is placed on the next digit.

FIG. 10(6): When the finger 11 depresses the portion of the bar switch 2 near the portion corresponding to the labeled letter "v", the letters "ov" and the letters "tuvwx" with the cursor under the letter "v" are displayed.

It may be possible that any other combination of the letters can be displayed to assist in inputting the letters.

The flow chart of FIG. 11 is such that steps 112 and m12 of the flow charts of FIGS. 7 and 8 are replaced by step n30 of FIG. 11 and step n31 of FIG. 11 is added following step n16 of FIG. 11. In this preferred form, the display 5 should display 12 digits.

Step n30: The letter codes corresponding to the preceding and the following four letters of the X register as contained within the register A are entered into 8-12 figures of the X register. Therefore, as FIGS. 10(3) to 10(6) show, the letters are displayed.

Step n31: When the bar switches 2 and 3 are separated, the NULL code is entered into the 8-12 figures of the X register, so that the letters are erased as FIGS. 10(1) and 10(5) show.

The letters to assist in inputting can be running or the cursor added to the letters can be running.

Further attention is now directed to another preferred form of the present invention.

Figure 12:
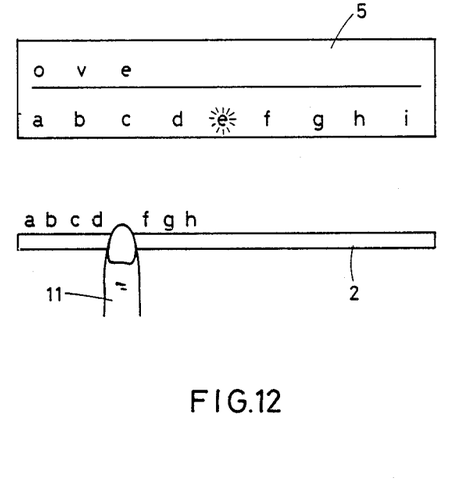
Figure 13:
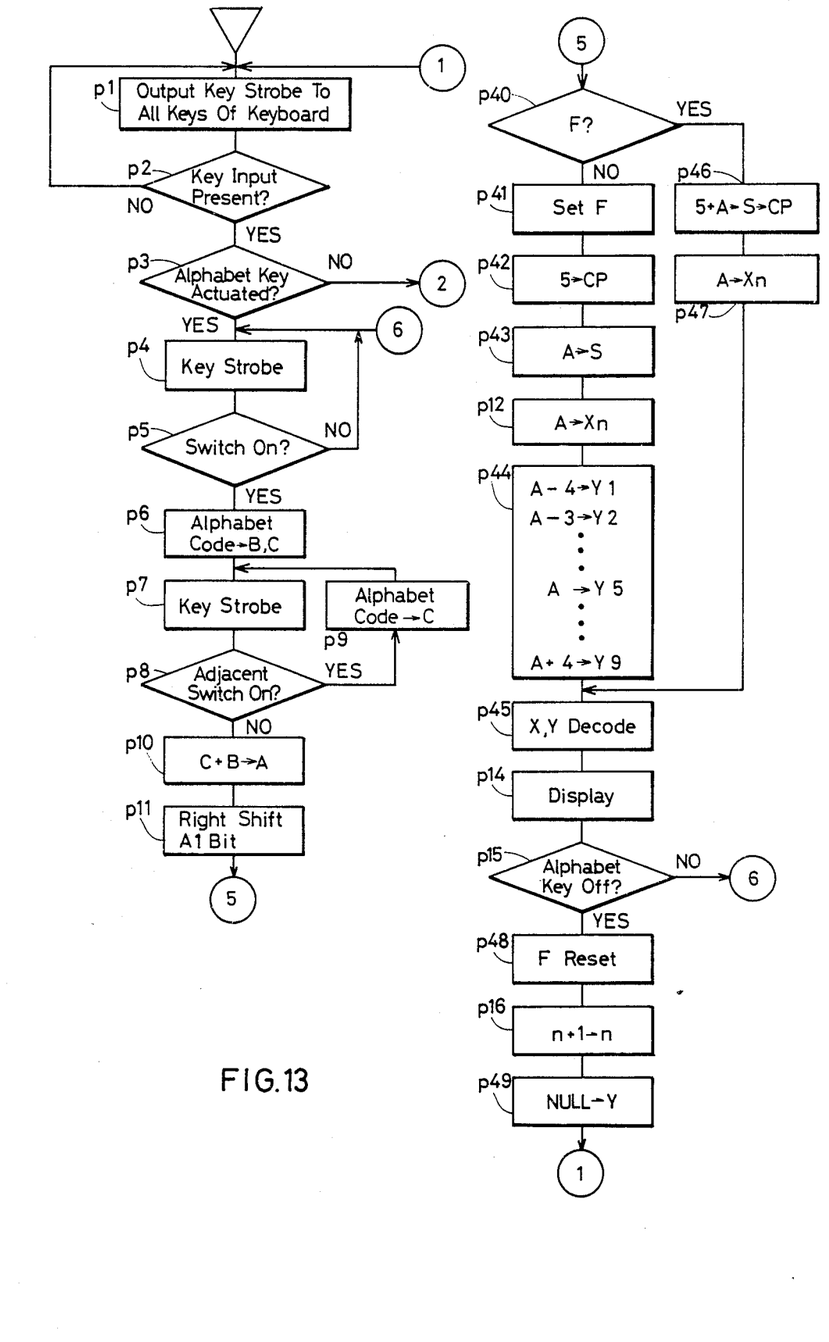

FIG. 12 shows a further preferred form of the present invention. FIG. 13 shows a flow chart of the operation of FIG. 12.

To be suitable for this preferred form of the present invention, the display 5 should be a two-story structure in each of which the letters are displayed. In the upper story, the previously input letters "ov" and the presently input letter "e" are displayed. In the lower story, the letters "abcdefghi" near the presently input letter "e" are displayed to assist in inputting, and the letter identical with the presently input letter "e" is flickered.

The ROM 20 includes the flag F, the pointer CP, the register S, and the register Y. The flag F indicates whether the bar switches 2 and 3 are being operated. The pointer CP indicates the display flickering position. The register S is provided for sheltering the first letter code input by actuating the bar switches 2 and 3. The register Y is provided for storing data to be displayed in the lower story.

Steps p1 to p11 are identical to those as previously described. When the finger 11 depresses the bar switch 2 near the labeled letter "e", step p40 following step p11 is selected.

Step p40: It is detected whether the flag F is set.

Step p41: If the flag F is not set, the flag F is set.

Step p42: Information "5" is entered into the pointer CP to indicate that the display position is the fifth position.

Step p43: The contents of register A are entered into register S.

Step p12: The contents of the register A are input into register X.

Step p44: The calculated results of "−4", "−3" ... "−0" ... "+3" and "+4" from the data of register A are entered into the first to the ninth digits of the register Y, respectively.

Step p45: The data of registers X and Y are decoded.

Step p14: The decoded data are displayed as the nine letters "abcdefghi" and the letter "e" is flickered.

Step p46: When the flag F is set in step p40, step p46 is selected, so that the display position is set into the pointer CP.

Step p47: The contents of register A are entered into register X. Thereafter, step p45 is selected.

Thus, while the finger 11 is rotated when actuating the bar switches 2 and 3, the key switch position corresponding to the shifted finger 11 is set into the pointer CP, so that the shifted letter is displayed.

When the bar switches 2 and 3 are separated, steps p15 to p48 are selected, so that the flag F is reset.

In step p49 following step p16, the NULL code is entered into the register Y, so that the display at the lower story is erased.

While only certain embodiments of the present invention have been described, it will be apparent to those skilled in the art that various changes and modifications may be made therein without departing from the spirit and scope the present invention as claimed.

What is claimed is:

1. A compact key input system for introducing character information into a device comprising:
    multicharacter key input means for introducing a plurality of characters, said key input means including;
    a substrate,
    a plurality of key contacts formed on said substrate, each of said plurality of key contacts directly corresponding to one of said plurality of characters and being spaced apart by less than the width of a human finger,
    a flexible key surface spaced apart from said plurality of key contacts,
    contact means, supported by said flexible key surface, for electrically contacting at least a pair of said plurality of key contacts upon depression of said flexible key surface at a desired point,
    a plurality of character identifying indicia sequentially positioned adjacent each other directly above said flexible key surface, each indicia being associated with a single one of said plurality of characters which directly correspond to said plurality of key contacts associated with that single character;
    actuation detection means for monitoring said key input means to determine which of said plurality of key contacts have been electrically contacted by said contact means and for producing a character signal identifying the character associated with said electrically contacted key contact;
    indicator means, responsive to said character signal produced by said actuation detection means, for indicating the character defined thereby; and
    character shift key input means for developing a new said character signal representing a character having an indicia adjacently disposed along said flexible key surface with respect to the indicia of the character identified by said character signal produced by said actuation detection means, said shift key input means shifting one said character for each actuation thereof.

2. The system of claim 1 wherein said indicator means includes an alphabetical display which displays the character defined by said character signal.

3. The device of claim 2, wherein said alphabetical display is adapted to display at least one additional character disposed sequentially adjacent said detected character.

4. The device of claim 2, wherein said alphabetical display is a two line split screen display.

5. The system of claim 1 wherein said characters include the English alphabet.

6. The system of claim 1 wherein said characters include Japanese characters.

7. A compact key input system for introducing character information into a device comprising:
    multicharacter key input means for individually introducing a plurality of characters, said key input means including;
    a substrate,
    a plurality of key contacts formed on said substrate, each of said plurality of key contacts directly corresponding to one of said plurality of characters and being spaced apart by less than the width of a human finger,
    a flexible key surface spaced apart from said plurality of key contacts,
    contact means, supported by said flexible key surface, for electrically contacting at least a pair of said plurality of key contacts upon depression of said flexible key surface at a desired point,
    a plurality of character identifying indicia sequentially positioned adjacent each other directly above said flexible key surface, each indicium being associated with a single one of said plurality of characters which directly correspond to said plurality of key contacts associated with that single character;
    actuation detection means for monitoring each of said plurality of key contacts to determine which of said key contacts have been actuated and for developing key contact codes representative thereof;
    end point determination means, responsive to said key contact codes produced by said actuation detection means, for determining first and second end key contact codes defining the end points of a coextensively actuated set of adjacent key contacts;
    means, responsive to said end point determination means, for averaging said first and second key codes to develop a key contact code at the midpoint of said coextensively actuated set of key contacts; and
    shift key input means for developing a new said key contact code representing a character having an indicium adjacently disposed along said flexible key surface with respect to the indicium of the character identified by said key contact code produced by said means for averaging, said shift key input means shifting one said character for each actuation thereof.

8. The system of claim 7 further comprising indicator means, responsive to said key contact code produced by said actuation, for indicating the character associated therewith.

* * * * *